(12) United States Patent
Schmidt et al.

(10) Patent No.: US 7,061,024 B2
(45) Date of Patent: Jun. 13, 2006

(54) LIGHT-EMITTING DEVICE COMPRISING AN EU(II)-ACTIVATED PHOSPHOR

(75) Inventors: Peter Schmidt, Aachen (DE); Thomas Jüstel, Aachen (DE); Walter Mayr, Alsdorf (DE); Hans-Dieter Bausen, Aachen (DE); Wolfgang Schnick, Gauting (DE); Henning Höppe, Kirchanschöring (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/531,034

(22) PCT Filed: Oct. 7, 2003

(86) PCT No.: PCT/IB03/04403

§ 371 (c)(1),
(2), (4) Date: Apr. 12, 2005

(87) PCT Pub. No.: WO2004/036962

PCT Pub. Date: Apr. 29, 2004

(65) Prior Publication Data

US 2006/0011922 A1    Jan. 19, 2006

(30) Foreign Application Priority Data

Oct. 14, 2002    (EP) .................. 02022898

(51) Int. Cl.
*H01L 29/22* (2006.01)
*H01L 29/227* (2006.01)
*H01L 33/00* (2006.01)
*C09K 11/02* (2006.01)
*C09K 11/08* (2006.01)
*C09K 11/77* (2006.01)

(52) U.S. Cl. .................. 257/98; 257/76; 252/301.4 R
(58) Field of Classification Search .................. None
See application file for complete search history.

(56) References Cited

U.S. PATENT DOCUMENTS

| 5,951,915 | A  | * | 9/1999 | Hase et al. ............ 252/301.4 F |
| 6,010,644 | A  | * | 1/2000 | Fu et al. ............... 252/301.4 R |
| 6,190,577 | B1 | * | 2/2001 | Hase et al. ........... 252/301.4 R |
| 6,284,156 | B1 | * | 9/2001 | Uehara et al. ........ 252/301.4 F |
| 6,657,379 | B1 | * | 12/2003 | Ellens et al. ................. 313/503 |
| 6,939,480 | B1 | * | 9/2005 | Aoki et al. ........... 252/301.4 F |

FOREIGN PATENT DOCUMENTS

WO    WO 01/24229 A2    4/2001

* cited by examiner

*Primary Examiner*—Nathan J. Flynn
*Assistant Examiner*—Victor A. Mandala, Jr.

(57) ABSTRACT

The invention concerns a light emitting device comprising a light emitting structure capable of emitting primary light of a wavelength less then 480 nm and a luminescent screen comprising a phosphor of general formula $(Sr_{1-a-b}Ca_bBa_cMg_dZn_e)Si_xN_yO_z{:}Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 \leq z \leq 2.5$. The invention also concerns a luminescent screen comprising a phosphor of general formula $(Sr_{1-a-b}Ca_bBa_cMg_dZn_e)Si_xN_yO_z{:}Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 \leq z \leq 2.5$. The invention also concerns a phosphor of general formula $(Sr_{1-a-b}Ca_bBa_cMg_dZn_e)Si_xN_yO_z{:}Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$.

11 Claims, 3 Drawing Sheets

LIGHT-EMITTING DEVICE COMPRISING AN EU(II)-ACTIVATED PHOSPHOR

Figure 1:
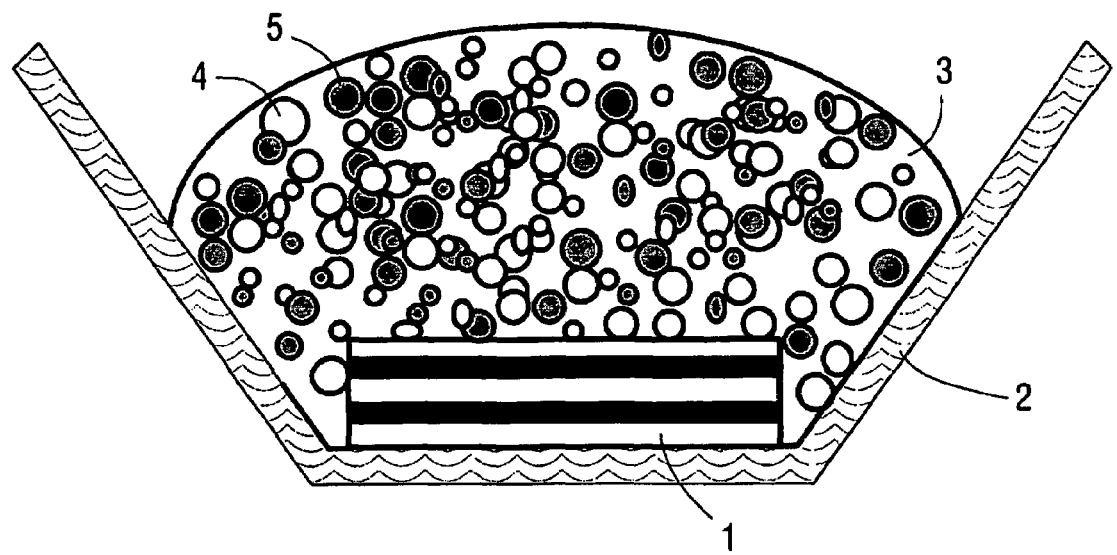

The invention relates to a light emitting device comprising a light emitting structure capable of emitting primary light of a wavelength, less then 480 nm, and a luminescent screen comprising an Eu(II)-activated phosphor for generation of specific colored light, including white light, by luminescent down conversion of the primary light into secondary light and additive color mixing of secondary light or primary and secondary light. Preferably the light-emitting device comprises a light emitting diode for a light emitting structure and a luminescent screen comprising an Eu(II)-activated phosphor or a combination such phosphor with various other phosphors described as a phosphor blend. In particular, the light-emitting device employs a blue LED and a mixture of red and green phosphors for the production of white light.

In this disclosure, a phosphor blend is defined as any combination of two or more photoluminescent materials the output of which, in combination with the emission of the light emitting diode, is capable of producing colored emission including white emission with a high color rendering index value or specific broad band or multi-band emission with defined color coordinates.

The phosphor or phosphor blend absorbs completely or partly the primary light emitted by the light-emitting diode and emits a secondary light of wavelengths higher than that one of the primary light. The phosphors comprise at least a photoluminescent material activated with europium(II) and containing at least one element selected from the group M=Sr, Ca, Ba, Mg, Zn in an inorganic host lattice.

There is an ongoing need to generate new phosphor compositions to improve efficiency and color quality in light emitting devices, particularly in the production of white light. Phosphors are luminescent materials that can absorb an excitation energy (usually radiation energy) and store this energy for a period of time. The stored energy is then emitted as radiation of a different energy than the initial excitation energy. For example, "down-conversion" refers to a situation where the emitted radiation has less quantum energy than the initial excitation radiation. Thus, the energy wavelength effectively increases, and this increase is termed a "Stokes shift". "Up-conversion" refers to a situation where the emitted radiation has greater quantum energy than the excitation radiation ("Anti-Stokes shift").

Improvements in efficiency and color quality in phosphor-based devices are constantly being developed. "Efficiency" relates to the fraction of photons emitted with respect to a number of photons initially provided as excitation energy. Inefficient conversion results when at least a portion of the energy is consumed by non-radiative processes. Color "quality" can be measured by a number of different rating systems. "Chromaticity" defines color by hue and saturation. "CIE" is a chromaticity coordinate system developed by Commission Internationale de l'Eclairage (International commission on illumination). The CIE Chromaticity Coordinates are coordinates that define a color in "1931 CIE" color space. These coordinates are defined as x, y, z and are ratios of the three standard primary colors, X, Y, Z (tristimulus values), in relation to the sum of the three tristimulus values. A CIE chart contains a plot of the x, y and z ratios of the tristimulus values versus their sum. In the situation where the reduced coordinates x, y, z add to 1, typically, a two-dimensional CIE (x, y) plot is used.

White-like colors can be described by a "correlated color temperature" (CCT). For example, when a metal is heated, a resulting light is emitted which initially glows as a red color. As the metal is heated to increasingly higher temperatures, the emitted light shifts to higher quantum energies, beginning with reddish light and shifting to white light and ultimately to a bluish-white light. A system was developed to determine these color changes on a standard object known as a blackbody radiator. Depending on the temperature, the blackbody radiator will emit white-like radiation. The color of this white-like radiation can then be described in the CIE chromaticity chart. Thus, the correlated color temperature of a light source to be evaluated is the temperature at which the blackbody radiator produces the chromaticity most similar to that of the light source. Color temperature and CCT are expressed in degrees Kelvin.

A "color rendering index" (CRI) is established by a visual experiment. The correlated color temperature of a light source to be evaluated is determined. Then eight standard color samples are illuminated first by the light source and then by a light from a blackbody having the same color temperature. If a standard color sample does not change color, then the light source has a theoretically perfect special CRI value of 100. A general color rendering index is termed "Ra", which is an average of the CRIs of all eight standard color samples.

Older white lamps involved emission of light over a broad wavelength range. It was then discovered that a mixture of two or three different light colors could simulate a white-like color, where each emission comprised a relatively narrow wavelength range. These lamps afforded more control to manipulate the white color because emissive properties (emission energy and intensity) of the individual red, green and blue light sources can be individually tailored. This method thus provided the possibility of achieving improved color rendering properties.

An example of a two-color lamp comprises one phosphor and light emitting structure capable of emitting primary light of a wavelength, less then 480 nm. Light emitted by the phosphor combines with unabsorbed light from the light emitting structure to produce a white-like color. Further improvements in fluorescent lamps involved three different light colors (i.e. a tri-color lamp) resulting in white light at higher efficiencies. One example of a tri-color lamp involved blue, red and green light-emitting phosphors. Other previous tri-color lamps comprised a combination of light from two phosphors (a green and red phosphor) and unabsorbed light from a mercury plasma excitation source.

Previous tri-color lamps involving a mercury plasma excitation source, however, suffer many disadvantages including: (1) a need for high voltages which can result in gaseous discharge with energetic ions; (2) emission of high-energy UV quanta; and (3) correspondingly low lifetimes. Thus, there is an ongoing need for devices that overcome these deficiencies.

WO 01/24229 discloses to a tri-color lamp for generating white light. In particular, WO 01/24229 relates to a phosphor mixture comprising two phosphors having host sulfide materials that can absorb radiation emitted by a light emitting diode, particularly a blue LED. This arrangement provides a mixing of three light sources—light emitted from the two rare earth ion, to allow matching of the phosphors in relation to the LED emitted radiation. Power fractions of each of the light sources can be varied to achieve good color rendering. WO 01/24229 also relates to an alternative to a green LED comprising a single green phosphor that absorbs radiation from a blue LED. A resulting device provides green light of high absorption efficiency and high luminous equivalent values.

There remains a continued challenge to uncover phosphor compositions and mixtures of these compositions to provide improved properties, including improved efficiency, color rendering (e.g. as measured by high color rendering indices) and luminance (intensity), particularly in a tri-color, white lamp.

A reduction in the luminance of a phosphor occurs when it is operated at an elevated temperature. Such reduction of luminance at elevated temperatures is referred to as thermal quenching. Normally, thermal quenching is considered within the context of a configuration coordinate diagram and is attributed to a decreasing radiative recombination efficiency of the phosphor as the photon density increases with increasing temperature. Thus, thermal quenching is due to an optical effect associated with the temperature dependence of the radiative recombination efficiency.

It has been observed that photoluminescent phosphor compounds have characteristic ranges of luminescent quenching temperatures. That is, when the phosphor is excited into luminescence as for example by subjecting the same to radiation from a source of ultraviolet light, the intensity of the luminescence will gradually decrease as the temperature of the phosphor is raised through a specified range of temperatures. For example, the compound Zn.80 Cd.20 S: AgCl will gradually quench from bright green, to dull green, to green gray, to gray, to black, as the temperature is increased from 95° C. to 105° C. The temperature ranges of the compounds provided by the afore described basic phosphor system are found to be determined by the composition of their anionic component. Phosphor compounds may be therefore made to have different quenching temperature ranges as well as different color characteristics. The thermal quenching at higher temperatures reduces the LED efficiency, in particular at high chip temperatures. Therefore it is desirable to replace sulfide phosphors by non-sulfide phosphors with a higher thermal quenching temperature.

One aspect of the present invention provides a light emitting device comprising a light emitting capable emitting a pattern of primary light of a first wavelength less then 480 nm. The device further comprises a luminescent screen comprising a phosphor or a phosphor blend comprising a phosphor of general formula
$(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$.

Such a device shows high efficiency, particularly at operating temperature above 200° C., because of the high quenching temperature of such a phosphor. Furthermore such light-emitting device offers the following advantages:
a) High chemical stability of luminescent composition
b) Short decay time resulting in little saturation
c) Very low thermal quenching of emission
d) Very high lumen equivalent
e) Non-toxic material, cheap starting materials Preferably the invention provides a light-emitting device wherein the light emitting structure is capable of emitting primary light of a wavelength from 450 to 480 nm in the blue spectral range.

In particular, the invention provides a light-emitting device, wherein the light-emitting structure is a blue emitting LED.

Especially, when the phosphor is comprised in a thin film layer the high quenching temperature of the phosphor is of advantage.

Another aspect of the present invention provides a light emitting device comprising a light emitting structure capable of emitting primary light o a wavelength less then 480 nm and a luminescent screen a first green phosphor and a second red phosphor. The first green phosphor has the general formula $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$. The second red phosphor may be selected from the group of $(Sr_{1-x-y}Ba_xCa_y)S:Eu$ wherein $0 \leq x < 1$ and $0 \leq y < 1$; CaS:Ce, Cl;

$Li_2SrSiO_4:Eu$; $(Sr_{1-x}Ca_x)SiO_4:Eu$ wherein $0 \leq x < 1$; $(Y_{1-x}Gd_x)_3(Al_{1-y}Ga_y)_5O_{12}:Ce$ wherein $0 \leq x < 1$ and $0 \leq y < 1$ and $(Sr_{1-x-y}Ba_xCa_y)_2Si_5N_8:Eu$ wherein $0 \leq x < 1$ and $0 \leq y < 1$. The emission spectrum of such a phosphor composition has the appropriate wavelengths to obtain together with the blue light of the LED a high quality white light with good color rendering at the required color temperature.

In particular the invention relates to a lamp, such as a low pressure mercury discharge lamp, a high pressure mercury discharge lamp, a sulfur discharge lamp, a molecular radiator discharge lamp and a white light LED lamp.

The invention also relates to a luminescent screen comprising a phosphor of general formula $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$.

Such luminescent screen is useful in a low pressure mercury discharge lamp, a high pressure mercury discharge lamp, a sulfur discharge lamp, a molecular radiator discharge lamp and a white light LED lamp.

Another aspect of the present invention provides a phosphor composition comprising a phosphor of general formula $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$ and comprising as a host lattice an alkaline earth oxynitridosilicate lattice and divalent europium as a dopant. A phosphor of general formula $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$ absorbs photons efficiently, especially photons of a blue LED operating at 450 nm and shows high quantum efficiency upon excitation of such wavelength. Such phosphor shows high quenching temperature of TQ 50% at 275° C. The phosphor comprises as a host an alkaline earth oxynitridosilicate lattice and divalent europium as a dopant and the phosphor or phosphor blend is positioned in the light pattern.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For the purposes of clarity, not every component is labeled in every figure, nor is every component of each embodiment of the invention shown where illustration is not necessary to allow those of ordinary skill in the art to understand the invention.

FIG. 1 shows a schematic view of a tri-color LED lamp comprising a two-phosphor mixture of $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$ and $Sr_2Si_5N_8:Eu$ positioned in a pathway of light emitted by an LED structure.

Figure 2:
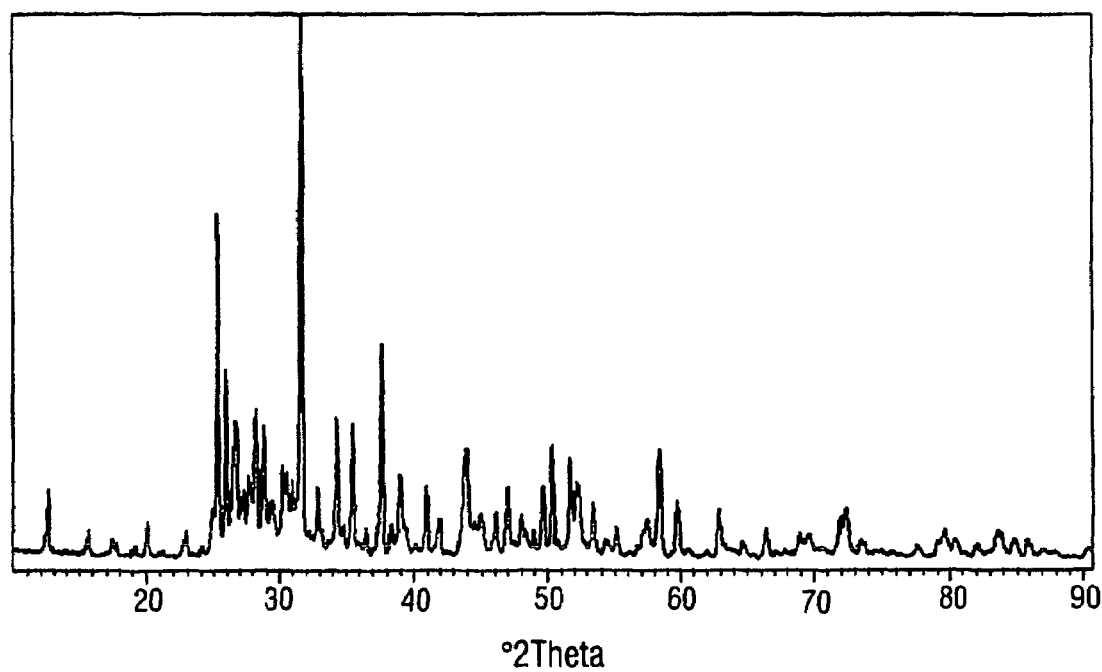

FIG. 2 discloses the X-ray diffraction diagram of $Sr_{0.96}Si_2N_2O_2:Eu_{0.04}$.

Figure 3:
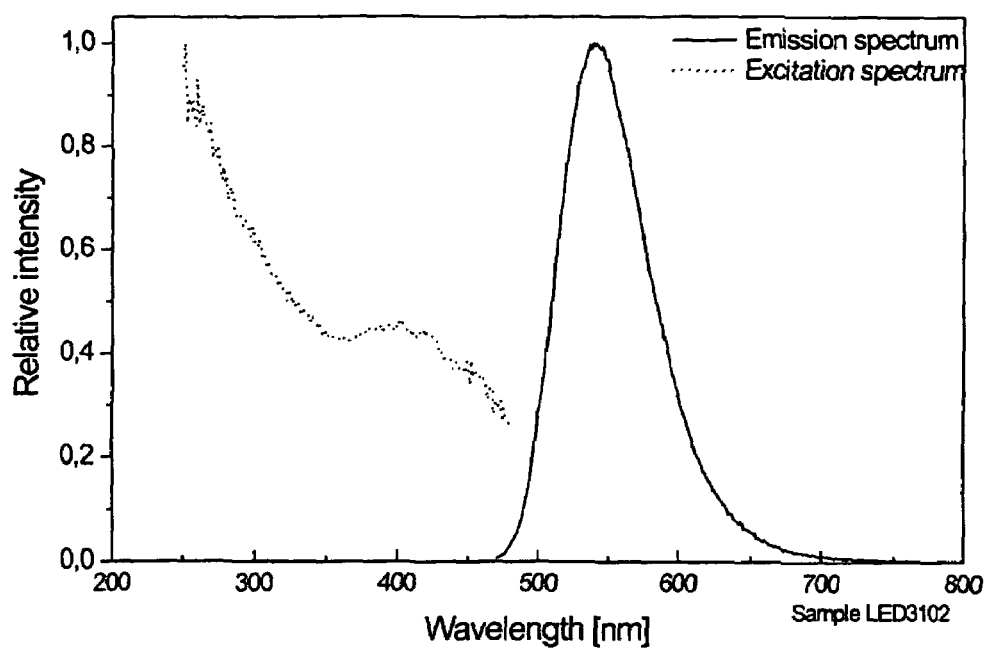

FIG. 3 discloses an overlay of emission and excitation spectrum of $Sr_{0.96}Si_2N_2O_2:Eu_{0.04}$ upon excitation by a blue LED at 460 nm.

Figure 4:
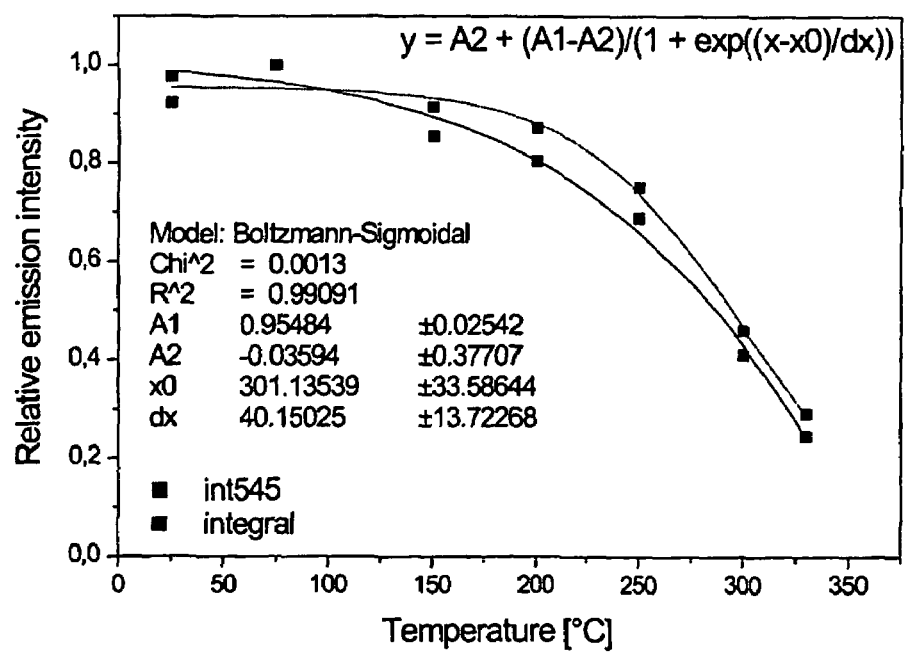
Figure 5:
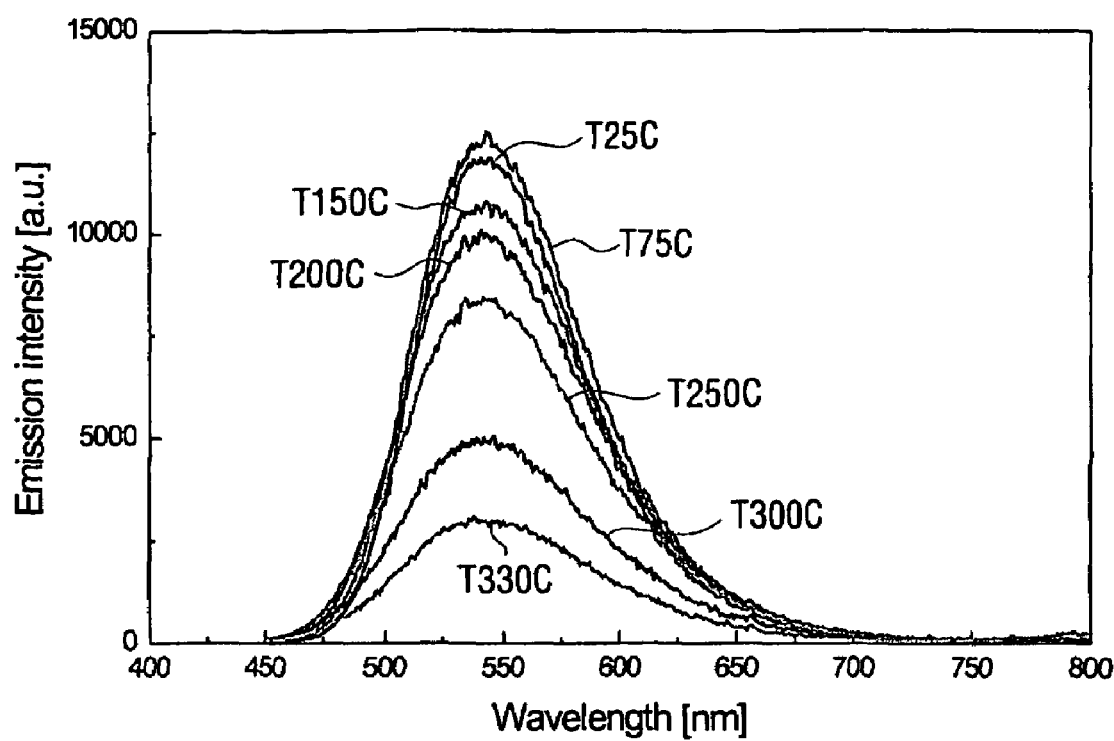

FIG. 4 discloses the thermal quenching of the photoluminescence of $Sr_{0.96}Si_2N_2O_2:Eu_{0.04}$ monitored under 430 nm excitation and FIG. 5 discloses a simulation of spectra of a mixture $Sr_{0.96}Si_2N_2O_2:Eu_{0.04}$ and CaS:Eu upon excitation by a blue LED at 430 nm at different color temperatures.

The invention relates, in part to the discovery that a light emitting device employing specific green and red phosphors excitable by a common light emitting structure can achieve white light at higher efficiencies with superior color rendering over previous fluorescent lamps and are not apt to substantial quenching at operating temperature above 200° C. and up to 275° C.

An advantageous feature of the present invention involves the use of an LED as a light emitting structure. An LED has a p-n junction between doped semiconductor regions.

Upon application of a current, there can exist sufficient energy to allow electrons and holes to cross the p-n junction such that a resulting recombination of electrons and holes causes emission of radiation. Advantages of LEDs over other excitation energy sources include small size, low power consumption, long lifetimes and low amounts of thermal energy emitted. In addition, LEDs have small dimensions that allow miniaturization of devices.

In one embodiment, the common LED is a blue LED. The use of blue light as an excitation radiation over other light sources has been found to be particularly advantageous in that conversion efficiency to visible light is higher. In one embodiment each phosphor is capable of being excited by a common LED which emits radiation at a wavelength from about 450 nm to about 480 nm. It has been found that color rendering can decrease at excitation energies below 450 nm whereas absorption by the phosphors decreases at excitation energies greater than 480 nm. An example of a blue LED that emits radiation in the above-mentioned energy ranges is a (In,Ga)N diode.

A blue light source can provide inherent advantages over UV excitation sources in that power efficiency is increased for red and green phosphors excited by blue light. The present phosphor materials generally require lesser Stokes shifts than phosphors of the previous devices. For example, certain tri-color prior art fluorescent lamps incorporate mercury plasmas, which provide a UV-emission, centered at approximately 4.9 eV. This UV light excites blue, red and green phosphors such that resulting emission spectra show maximum intensities at energies of approximately 2.8 eV (unabsorbed light), 2.3 eV (green) and 2.0 eV (red) respectively. Significant Stokes shifts are obviously involved in this situation. Power efficiency, however, is limited by quantum deficit, which is the difference of the quantum energies of exciting and emitted quanta. Thus, for the example described above, power efficiency of the green light is, on average, (4.9 eV–2.3 eV)/4.9 eV=53%. In contrast, green (2.3 eV) and red (2.0 eV) phosphors excited by a blue LED with an emission of about 2.7 e V (~460 nm) exhibit smaller Stokes shifts and quantum deficits, and accordingly power efficiency is greater.

A detailed construction of such light-emitting device is shown in FIG. 1.

FIG. 1 shows a schematic view of the device of the present invention. The device comprises LED 1. LED 1 is positioned in a reflector cup 2. LED 1 emits light in a pattern. A phosphor composition 4,5 is positioned in the pattern. The phosphor composition is embedded in a resin 3. In this example, reflector cup 2 can modify light pattern if light is reflected into a space not previously covered by the initial light pattern (e.g. in the case of a parabolic reflector). It is understood that one of ordinary skill in the art can provide reflector cup 2 in any shape that optimizes reflection of light back to phosphor composition 4,5, or optimizes positioning of LED 1 to provide a light pattern for efficient conversion. For example, the walls of reflector cup 2 can be parabolic.

Those and similar constructions can be used. Moreover the invention is especially useful in a low pressure mercury discharge lamp, a high pressure mercury discharge lamp, a sulfuer discharge lamp and a molecular radiator discharge.

Emphasis is given in more detail to the phosphors and phosphor blends to be used in this invention.

Phosphors in general comprise a host lattice and dopant ions. Typically, the host material has an inorganic, ionic lattice structure (a "host lattice") in which the dopant ion replaces a lattice ion. The dopant is capable of emitting light upon absorbing excitation radiation. Ideal dopants strongly absorb excitation radiation and efficiently convert this energy into emitted radiation. If the dopant is a rare earth ion, it absorbs and emits radiation via 4f—4f transitions, i.e. electronic transitions involving f-orbital energy levels. While f—f transitions are quantum-mechanically forbidden resulting in weak emission intensities, it is known that certain rare earth ions, such as divalent Europium strongly absorb radiation through allowed 4f–5df transitions (via d-orbital/f-orbital mixing) and consequently produce high emission intensities.

The emissions of rare earth dopants, such as divalent Europium can be shifted in energy depending on the host lattice in which the dopant ion resides. Thus, this aspect of the invention lies, in part, in the discovery that certain rare earth dopants efficiently convert blue light to visible light when incorporated into an appropriate host material. The phosphor according to the invention comprises a host lattice, which is an earth alkaline oxynitridosilicate, i.e. a host lattice which includes an oxynitridosilicate and earth alkaline metal ions.

The phosphor has the general formula $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$.

Preferably the amount of dopant present in the host lattice is from 0.02 mol % to 20 mol %.

The new host lattices of the oxynitridosilicate type are thought to be based on a three dimensional network of $SiN_3O$-tetrahedra in which alkaline earth ions such as calcium, strontium, barium, magnesium and zinc as well as europium(II) are incorporated. The host lattice is related to the refractory oxynitride $Si_2N_2O$ made by heating to 1450° C. a mixture of $Si+SiO_2$ in a stream of argon containing 5 percent $N_2$. $Si_2N_2O$ is related structurally to both $SiO_2$ and $Si_3N_4$. It has two crystalline forms, both with phenacite-like structures, in which Si has 4 tetrahedral neighbours and N is bonded to 3 Si (Si—N, 1-74 A). The oxynitride is built of $SiN_3O$ tetrahedra, which are linked to form a 3-dimensional framework. Puckered hexagonal nets consisting of equal numbers of Si and N atoms are linked together through 0 atoms which complete the tetrahedra around the Si atoms. One half of the Si atoms are linked to the layer above and the remainder to the layer below. In the resulting structure every 0 atom is connected to 2 Si (as in $SiO_2$), and N and Si are respectively 3- and 4-connected, as in $Si_3N_4$.

X-ray diffraction of $Sr_{0.96}Si_2N_2O_2:Eu_{0.04}$ as shown in FIG. 2 is consistent with the structure of $SrO.Si_2N_2O$ [W. H. Zhu et al., J. Mat. Sci. Lett. 13 (1994) 560] with certain small deviations of position and intensity due to the substitution of smaller divalent metal ions and europium for strontium.

Another advantageous feature of the present invention is to provide a phosphor mixture excitable by one common blue energy source of a relatively narrow line width emit light at two different energy ranges (e.g. red and green). Strategies to provide appropriate phosphors are disclosed here. In one embodiment, the dopant is the same in the first and second phosphor. The red and green emissions of the two phosphors can be tuned by selecting an appropriate host material. The green phosphor is preferably $Sr_{0.096}Si_2O_2N_2:Eu_{0.04}$. The red phosphor is selected from the group consisting of $(Sr_{1-x-y}Ba_xCa_y)S:Eu$ wherein $0 \leq x < 1$ and $0 \leq y < 1$;

$CaS:Ce,Cl$; $Li_2Sr\ SiO_4:Eu$; $(Sr_{1-x}Ca_x)SiO_4:Eu$ wherein $0 \leq x < 1$; $(Y_{1-x}Gd_x)_3(Al_{1-y}Ga_y)_5O_{12}:Ce$ wherein $0 \leq x < 1$ and $0 \leq y < 1$ and $(Sr_{1-x-y}Ba_xCa_y)_2Si_5N_8:Eu$ wherein $0 \leq x < 1$ and $0 \leq y < 1$.

In the operation of the embodiment of the present invention radiation of the light emitting structure excites the phosphors and produces a bright and uniform luminescence over the entire surface of the luminescent screen.

If the light emitting device of the present invention is a white light such as a low pressure mercury discharge lamp, a high pressure mercury discharge lamp, a sulfur discharge lamp, a molecular radiator discharge lamp and a white light LED lamp, it is particularly advantageous in that the color rendering properties are far superior to those of any previous white lamps. In one embodiment, the lamp is capable of emitting radiation having a color rendering index, Ra of at least about 60 at a color temperature from about 2700 K to about 8000 K, preferably an Ra of at least about 70, more preferably an Ra of at least about 80 and even more preferably an Ra of at least about 90. In a preferred embodiment, the lamp generates a CRI, Ra of greater than 70 for CCT values of less than 6000 K.

By varying optical properties of each light emitting structure in the device, the device can be designed to have desired characteristics depending on a particular application. For example, certain devices may be required to generate light of high intensity and only adequate color rendering is needed, whereas other applications may require high color rendering properties, at the expense of efficiency. Alternatively, color rendering can be sacrificed for higher efficiency. For example, a 50% increase in efficiency can be achieved by decreasing Ra down to about 60. Changing relative power fractions of each light source can vary such properties. A "power fraction" is the fraction of light from each source that provides the final light color. Power fractions can be varied by, for example, changing a relative amount of phosphor material present in the device or varying dopant concentration.

It is understood that the phosphor composition can comprise more than two phosphors so long as optimal color rendering properties are achieved.

In one embodiment, the device further comprises a polymer for encapsulating the phosphor or phosphor blend. In this embodiment, the phosphor or phosphor blend should exhibit high stability properties in the encapsulant. Preferably, the polymer is optically clear to prevent significant light scattering. In one embodiment, the polymer is selected from the group consisting of epoxy and silicone resins. A variety of polymers are known in the LED industry for making 5 mm LED lamps. Adding the phosphor mixture to a liquid that is a polymer precursor can perform encapsulation. For example, the phosphor mixture can be a powder. Introducing phosphor particles into polymer precursor liquid results in formation of a slurry (i.e. a suspension of particles). Upon polymerization, the phosphor mixture is fixed rigidly in place by the encapsulation. In one embodiment, both the composition and the LED are encapsulated in the polymer.

The use of phosphors with general formula $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$ is especially advantageous if the phosphor composition is applied as a thin film or in a small volume, because they are not sensitive to higher temperatures, which result in thin layers due to heat generated by the Stokes shift together with strong absorption and consequently very small light penetration depth.

The phosphor comprising composition may be fabricated by eventually dry blending phosphors in a suitable blender and then assign to a liquid suspension medium or the individual phosphor or phosphors may be added to a liquid suspension, such as the nitrocellulose/butyl acetate binder and solvent solution used in commercial lacquers. Many other liquids including water with a suitable dispersant and thickener or binder such as polyethylene oxide can be used. The phosphor containing composition is painted or coated or otherwise applied on the LED and dried.

Otherwise the phosphor or phosphors can be combined with a suitable polymer system, such as polypropylene, polycarbonate, or polytetrafluoroethylene, to a phosphor composition, which is then coated or applied to the LED and dried, solidifies, hardeners, or cured. The liquid polymer system may optionally be UV cured or room temperature cured to minimize any heat damage to the LED.

Otherwise a clear polymer lens made of suitable plastic such as polycarbonate or other rigid transparent plastic is molded over the LED. Lens may be further coated with anti-reflective layers to facilitate light to escape the device.

Although the role of phosphor grain size (mean diameter of phosphor particles) is not completely understood, weight fractions may change depending on a particular grain size. Preferably, grain sizes are less than 15 μm, and more preferably, less than 12 μm, to avoid clogging of devices which dispose the phosphors. In one embodiment, the grain size of each phosphor type varies. In certain specific embodiments, the grain size of $(Sr_{1-a-b}Ca_bBa_cMg_dZn_e)Si_xN_yO_z:Eu_a$, wherein $0.002 \leq a \leq 0.2$, $0.0\ 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$ is less than about 10 μm. Other devices, however, can be prepared with larger grain sizes.

Although unabsorbed light emitted from the LED contributes to color rendering, unabsorbed light can sometimes escape without mixing with light emitted from the phosphors, resulting in a reduced overall efficiency of the device. Thus, in one embodiment, the LED and composition are positioned within a reflector cup. A reflector cup can be any depression or recess prepared from a reflecting material. By positioning the LED and phosphor particles in a reflector cup, unabsorbed/unmixed LED-emitted light can be reflected either back to the phosphor particles to eventually be absorbed, or mixed with light emitted from the phosphors.

The function and advantage of these and other embodiments of the present invention will be more fully understood from the examples below. The following examples are intended to illustrate the benefits of the present invention, but do not exemplify the full scope of the invention.

EXAMPLE 1

Preparation of $Sr_{0.96}Si_2N_2O_2:Eu_{0.04}$ 208.9 g (1.415 mol) $SrCO_3$ is mixed with 12.3 g (0.059 mol) $EuF_3$ and 206.8 g (4.423 mol) $Si_3N_4$ (min. 98% purity) in dry ethanol under argon. The ethanol is evaporated in a stream of argon and the dried powder mixture is then fired at 1400° C. for 1 hr in an $H_2/N_2$ atmosphere over charcoal in a tungsten boat. After milling the powder is fired at 1500° C. for 1 hr in an $H_2/N_2$ atmosphere, milled and washed with water several times.

EXAMPLE 2

White LED Comprising $Sr_{0.96}Si_2N_2O_2:Eu_{0.04}$ and $Sr_2Si_5N_8:Eu$

A phosphor blend comprising $Sr_{0.96}Si_2N_2O_2:Eu_{0.04}$ and $Sr_2Si_5N_8:Eu$ is suspended in silicone monomer oil and a droplet of the suspension is deposited onto an InGaN die. A catalyst is added to the silicone monomer to start the polymerization process, resulting in hardening of the silicone. Finally, the LED is sealed with a plastic cap.

EXAMPLE 3

White LED Comprising $Sr_{0.96}Si_2N_2O_2:Eu_{0.04}$ and SrS:Eu

A phosphor blend comprising $Sr_{0.96}Si_2N_2O_2:Eu_{0.04}$ and SrS:Eu is suspended in silicone monomer oil and a droplet of the suspension is deposited onto an InGaN die. A catalyst is added to the silicone monomer to start the polymerization process, resulting in hardening of the silicone. Finally, the LED is sealed with a plastic cap.

EXAMPLE 4

White LED Comprising $Sr_{0.96}Si_2N_2O_2:Eu_{0.04}$ and CaS:Eu

A phosphor blend comprising $Sr_{0.96}Si_2N_2O_2:Eu_{0.04}$ and CaS:Eu is suspended in silicone monomer oil and a droplet of the suspension is deposited onto an InGaN die. A catalyst is added to the silicone monomer to start the polymerization process, resulting in hardening of the silicone. Finally, the LED is sealed with a plastic cap.

The invention claimed is:

1. A light emitting device comprising a light emitting structure capable of emitting primary light of a wavelength less then 480 nm and a luminescent screen comprising a phosphor of general formula $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$.

2. The light emitting device according to claim 1, wherein the light emitting structure capable of emitting primary light of a wavelength from 450 nm to 480 nm.

3. The light-emitting device according to claim 1, wherein the light emitting structure is a blue-emitting LED.

4. The light-emitting device according to claim 1, wherein the phosphor is comprised in a thin film layer.

5. The light emitting device according to claim 1, wherein the luminescent screen comprises a green phosphor of general formula $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$ and a red phosphor.

6. The light emitting device according to claim 5, wherein the red phosphor is selected from the group of $(Sr_{1-x-y}Ba_xCa_y)S:Eu$ wherein $0 \leq x < 1$ and $0 \leq y < 1$; CaS:Ce,Cl; $Li_2SrSiO_4:Eu$; $(Sr_{1-x}Ca_x)SiO_4:Eu$ wherein $0 \leq x < 1$; $(Y_{1-x}Gd_x)_3(Al_{1-y}Ga_y)_5O_{12}:Ce$ wherein $0 \leq x < 1$ and $0 \leq y < 1$ and $(Sr_{1-x-y}Ba_xCa_y)_2Si_5N_8:Eu$ wherein $0 \leq x < 1$ and $0 \leq y < 1$.

7. The light-emitting device according to claim 1, wherein the device is a lamp.

8. A luminescent screen comprising a phosphor of general formula $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$.

9. A phosphor of general formula $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$.

10. A phosphor according to claim 9, wherein $1.9 \leq x \leq 2.1$, $1.9 \leq y \leq 2.1$ and $1.9 < z < 2.1$.

11. A phosphor according to claim 9, of general formula $Sr_{1-a}Si_2N_2O_2:Eu_a$.

* * * * *